United States Patent
Liao et al.

(10) Patent No.: US 7,271,609 B2
(45) Date of Patent: Sep. 18, 2007

(54) METHOD OF AUTOMATICALLY CREATING A SEMICONDUCTOR PROCESSING PROBER DEVICE FILE

(75) Inventors: Kevin Liao, Hsin-Chu (TW); Edward Chen, Pingtung County (TW); Win Hung, Hsinchu (TW); Jumbo Chuang, Hsinchu (TW); Chang-Chi Hsu, Hsinchu (TW); Chia-Ping Liu, Hsinchu County (TW); Chun-Chieh Hsiao, Tainan County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 74 days.

(21) Appl. No.: 10/908,537

(22) Filed: May 16, 2005

(65) Prior Publication Data

US 2006/0255824 A1    Nov. 16, 2006

(51) Int. Cl.
*G01R 31/26* (2006.01)

(52) U.S. Cl. .................................... 324/765

(58) Field of Classification Search .................... None
See application file for complete search history.

(56) References Cited

U.S. PATENT DOCUMENTS

| | | | |
|---|---|---|---|
| 5,851,848 A * | 12/1998 | Balamurugan | 438/14 |
| 6,362,013 B1 * | 3/2002 | Yoshimura | 438/14 |
| 6,380,000 B1 * | 4/2002 | Subramanian | 438/14 |
| 6,639,417 B2 * | 10/2003 | Takao | 324/765 |
| 6,774,620 B2 | 8/2004 | Nanbu | 324/158.1 |
| 7,039,556 B2 * | 5/2006 | Whitefield et al. | 702/183 |
| 2005/0288896 A1 * | 12/2005 | Whitefield et al. | 702/183 |
| 2006/0036394 A1 * | 2/2006 | Chen et al. | 702/123 |
| 2006/0128039 A1 * | 6/2006 | Lin et al. | 438/14 |

* cited by examiner

*Primary Examiner*—Jermele Hollington
(74) *Attorney, Agent, or Firm*—Baker & McKenzie LLP

(57) ABSTRACT

Described is a method for automatically generating a wafer prober file whereby testing parameters and die identities can be established for testing a complete semiconductor wafer and whereby acceptable or rejected dies can be identified and correlated later with where the good or bad dies are physically located on a wafer-under-test.

20 Claims, 6 Drawing Sheets

METHOD OF AUTOMATICALLY CREATING A SEMICONDUCTOR PROCESSING PROBER DEVICE FILE

TECHNICAL FIELD

The disclosed embodiments are directed to the manufacturing and test of semiconductor wafers, particularly relating to the probe test or wafer sort test for identifying good and/or bad dies on a semiconductor wafer.

BACKGROUND

In the semiconductor manufacturing process, thousands of individual circuits or dies are formed in a series of steps whereby all of the circuits or dies are formed in parallel as the silicon wafer passes through various steps called the wafer fabrication process or "wafer fab" process. During the final steps of the wafer fab process, the individual circuits on the wafer can be tested through a wafer test system, which includes a wafer probing machine or "prober" and a tester, before they are separated or "diced" from the semiconductor wafer for packaging. The prober and tester work together to identify bad devices prior to packaging, which can save considerable expense on the front end that would otherwise be incurred by packaging bad devices that could have been detected at the wafer level.

With modern semiconductor wafers now spanning 12 inches in diameter (~300 mm), wafers can include ten thousand or more devices. To test a wafer, each device must be identified and its position established so that each device can be correlated with the results of its respective electrical test during the probe test. Setting up the test program and making this correlation between the wafer image map and the test program can therefore be an elaborate and time-consuming process.

At present, the correlation of electrical test program to dies is done by mapping the relevant device-testing program and die identifier on the respective devices identified on the wafer image map. Although this needs to be done only once for a particular wafer type or wafer layout, at which time the mapping can be stored on the wafer tester or probe tester, enough of these one-time actions can nevertheless be very time-consuming in the factory environment.

SUMMARY

The present specification describes a method in which photo die information from the wafer image map that describes the positions of the many devices on the wafer can be automatically correlated with the device testing data. The described method further provides for automatic translation of this combined information into a format that is compatible with the needs of the prober or probe tester. This automated process relieves the manufacturing and testing personnel of the burden of manually correlating the device testing files to the individual die positioning and numbering data, which indicates their position on the semiconductor wafer to be tested.

As described, positional data for the various devices on the semiconductor wafer are provided through the photo die image or wafer image map, and this information can be used to direct the prober head to properly find various devices on the wafer for testing at the wafer sort test and to map those test results to the devices on the wafer. The integration of the test data and the wafer image map allows the prober to display an image illustrating the status of testing of the detected good or bad devices on the wafer.

The above summary outlines the embodiments described in this application, but this description is only to be used in the context of the entire specification to illustrate some of the major features of these embodiments. None of these embodiments are limiting of the scope of the invention, which must be determined by the claims set forth in the claims section.

Figure 1:
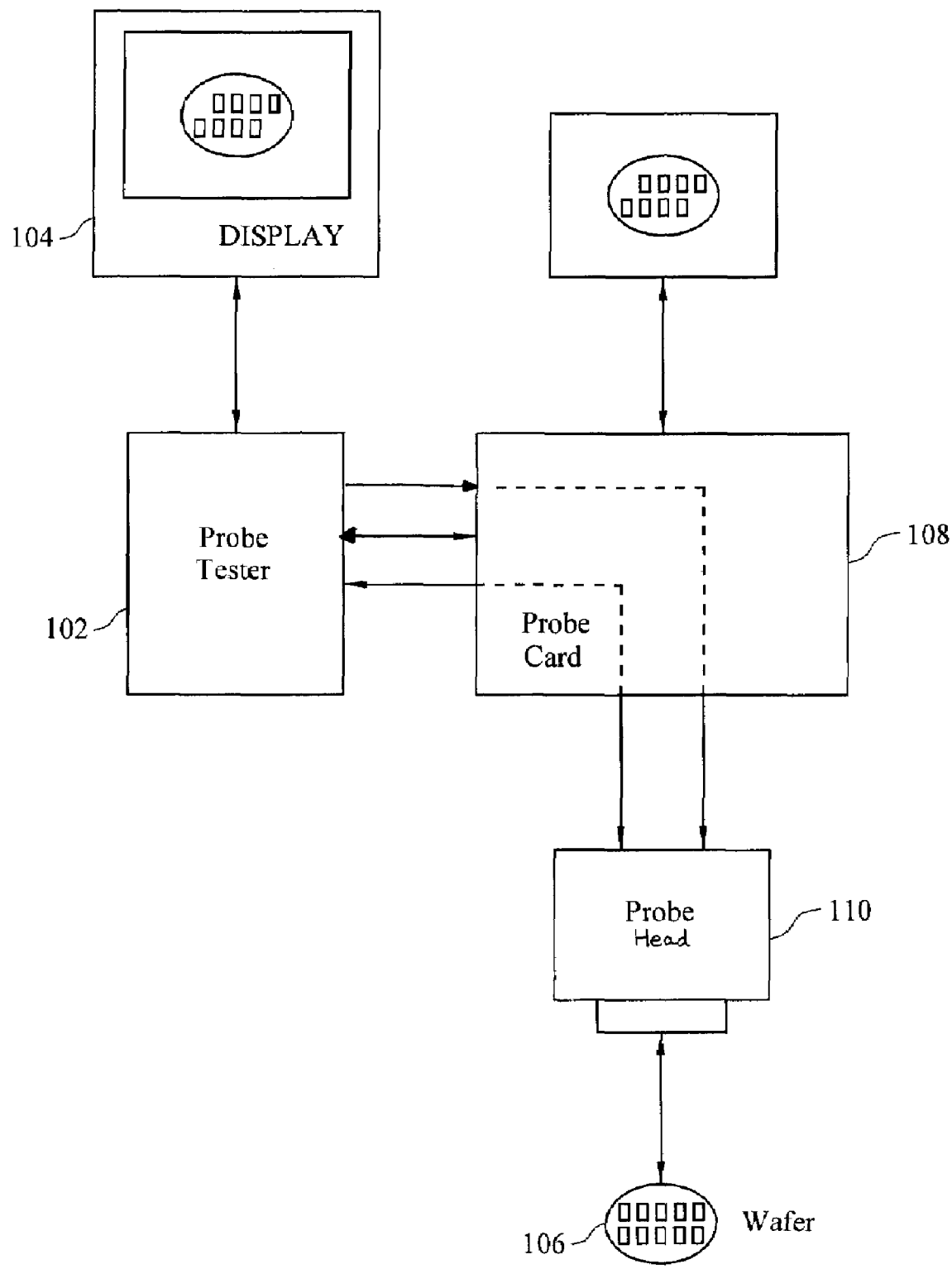
FIG. 1 is a block diagram of a wafer probe test set-up.

For clarity of illustration, elements illustrated in the figures have not necessarily been drawn to scale. Further, in some cases reference numerals have been repeated among the figures to indicate corresponding or analogous elements.

DESCRIPTION OF THE EMBODIMENTS

FIG. 1 is a block diagram of a wafer test system 100 that is used at the wafer sort process to identify dies on a semiconductor wafer as being good or bad. The wafer test system 100 includes a tester 102, which is connected to a display 104 that provides output for the test operator, and a prober 108, which provides the electrical interface between the tester 102 and the wafer 106 to be tested. The display 104 may include a user interface for a test operator's interaction with the wafer test system 100, as well as a real-time wafer map illustrating which dies have been tested and which have been identified as being good or bad during the testing process. As the processing continuous, certain dies on the display 104 would go from being untested to being positively identified as either good or bad dies on the wafer. This information will be kept—either electronically or with a paper printout—with the wafer and will travel with the wafer until the packaging or "back-end" process. By identifying certain bad dies on the wafer 106 on the front-end, it is possible to avoid the expense of packaging for the bad dies. The tester 102 interfaces with the wafer 106 through the prober 108, which provides electrical test signals to the wafer 106 through a probe head 110. The probe head 110 includes a set of pins that make electrical connection(s) to the dies or die when testing the wafer 106. As suggested in this figure, an image of the wafer 106 may be provided on the display 104 for the convenience of the test operator to see which of the devices have been tested as good, which of the devices have been tested as bad, and which of the devices have not yet been tested.

As can be seen from the image of the wafer 106 on the display 104, the dies on the wafer 106 are laid out in a matrix. One of the difficulties in initially setting up the wafer test system 100 for testing a new type of wafer 106 is that electrical test files for each of the dies within this matrix must be mapped to the relevant die. Historically, this has been done manually and can be a quite slow and laborious process due to the thousands of dies on a wafer. Further, even in the usual case where all or most of the dies would have in essence the same test program applied to them, each die must still be correlated to its physical position on the wafer so that subsequent packaging equipment in the semiconductor back-end will know which of the dies to package and which to discard. Thus, a mapping must be provided between the wafer test system 100 and the wafer image map from the photo die system, where the photo die system comprises the instructions for the "step-and-repeat" use of the semiconductor layer image reticles.

Figure 2:
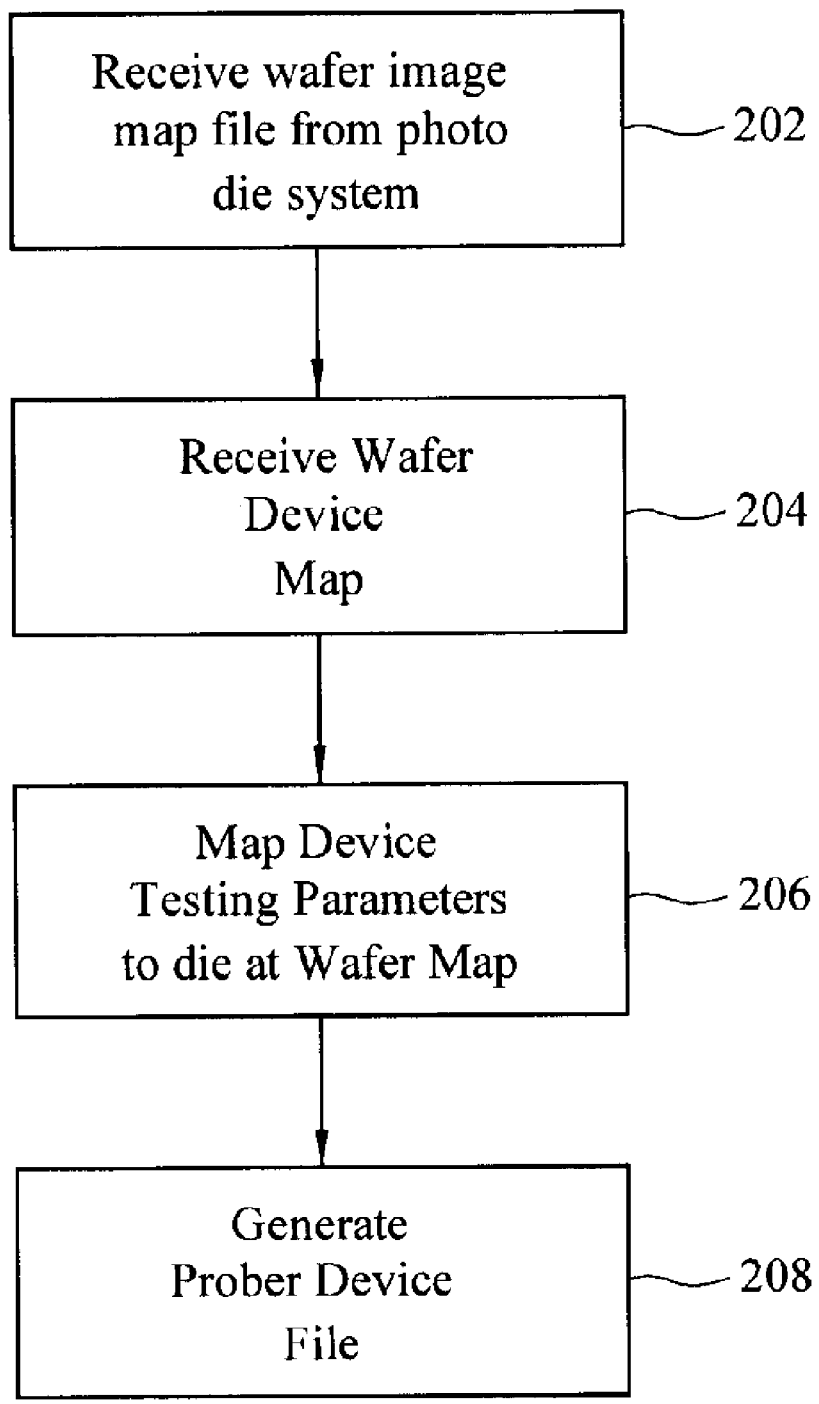
FIG. 2 is a flowchart of the prior art procedure for building a prober device file.

FIG. 2 shows the flowchart 204 that was used in the prior art for carrying out the step of mapping die positions from the wafer image map to the wafer test system 100, or particularly the process for prober device file. In this process, a first action 202 is of receiving the wafer image map file from the photo die system. This file is typically a text file containing information that describes the position of the many dies on the wafer matrix. Particularly, this information would have been used as a part of the photo die system for the step-and-repeat process by which the semiconductor layer image reticles are sequentially re-imaged in order to pattern the entire semiconductor wafer. Thus, this information might include starting positions for the die matrix along with offsets for the sequence of wafers and such other information as would define the position of the hundreds or thousands of dies on the wafer. At action 204, a device map is received for the wafer, wherein the device map defines the test algorithms and/or test parameters for the testing of the dies within the wafer. Obviously, the order of these two actions is not critical. The key issue is that both are brought together and must be correlated to each other, and the dies of one file must be mapped or correlated to the dies of the other. In the prior art, this has been a time-consuming and laborious task. Even improved systems to facilitate this mapping have provided a graphical user interface by which the user can manually (but graphically) map the dies of one file to the dies of another. Using the prior-art graphical mapping approach, a graphical user interface would allow a test operator to select, on the photo die map, dies of the wafer image map corresponding to dies in the wafer device map. This mapping process is shown in block 206 of FIG. 2, where the image data from the wafer dies must be correlated with the device testing parameters. At action 208, these two maps have been linked together and a formatted file compatible with the prober device must be generated. This formatted file is called the prober device file, and will contain all the information necessary for the prober 108 to properly position its probe head and to execute the various die test programs.

FIGS. 3-6 illustrate a new process for linking the wafer image map information to the test information of the device map, whereby the linking is done automatically to generate a prober device file with minimal user involvement. This new approach accordingly provides a manufacturing cost improvement by reducing the burden on front-end wafer test operators and eliminating the need for the operators to individually map die information in order to create these complicated prober device files.

Figure 3:
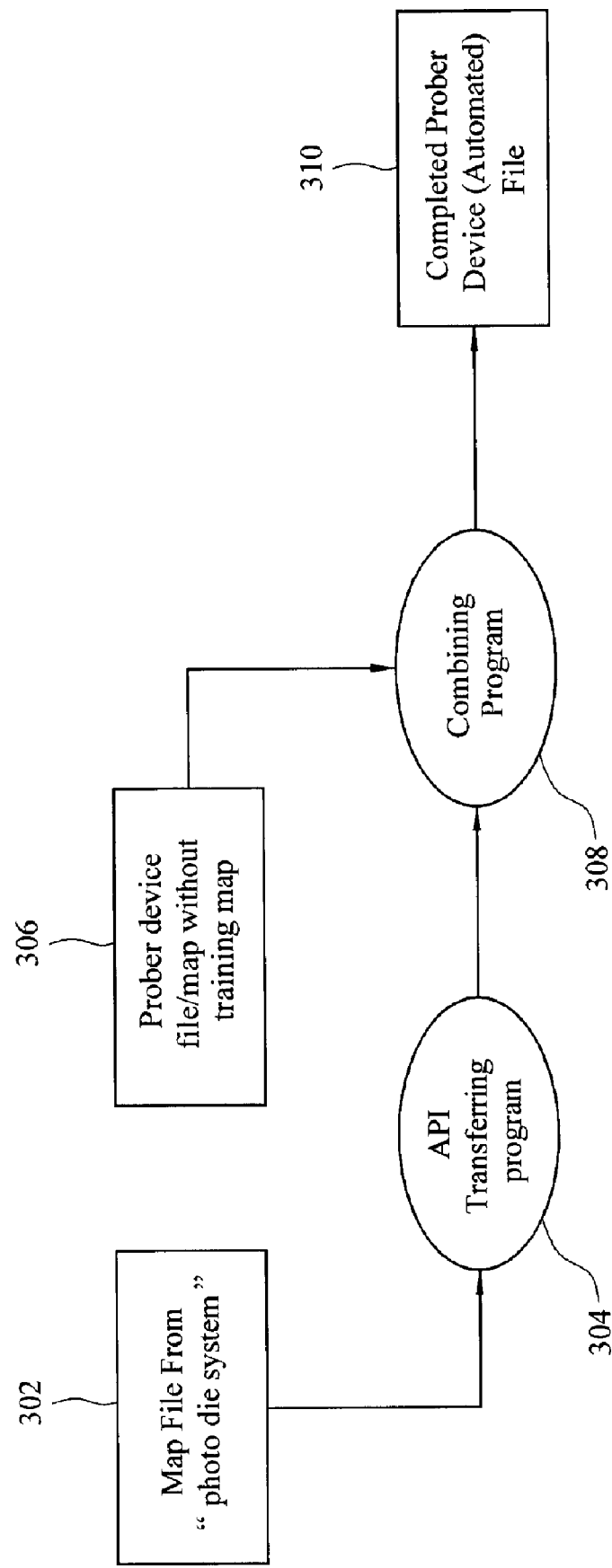
FIG. 3 is a flow diagram describing the data flow for automatically generating a prober device file.

FIG. 3 shows a process in which an image map file from the photo die system at 302 is provided to a transferring program AP1 304, which provides the information from the photo die system map into a format that is compatible with a prober device file. For example, this transferring program may shift the coordinate system, which may be different from the file that would be compatible with the particular prober. An incomplete prober device file or map that has not been trained to link the device map die to their associated locations on the wafer image map from the photo die system is provided at 306 to the combining program 308. The combining program 308 will then consolidate that information with the map file from the photo die system after it has been properly formatted or reformatted for compatibility with the particular prober being used in the process. The combining program will then combine those data and generate a completed prober device file 310 substantially without user input.

Figure 4:
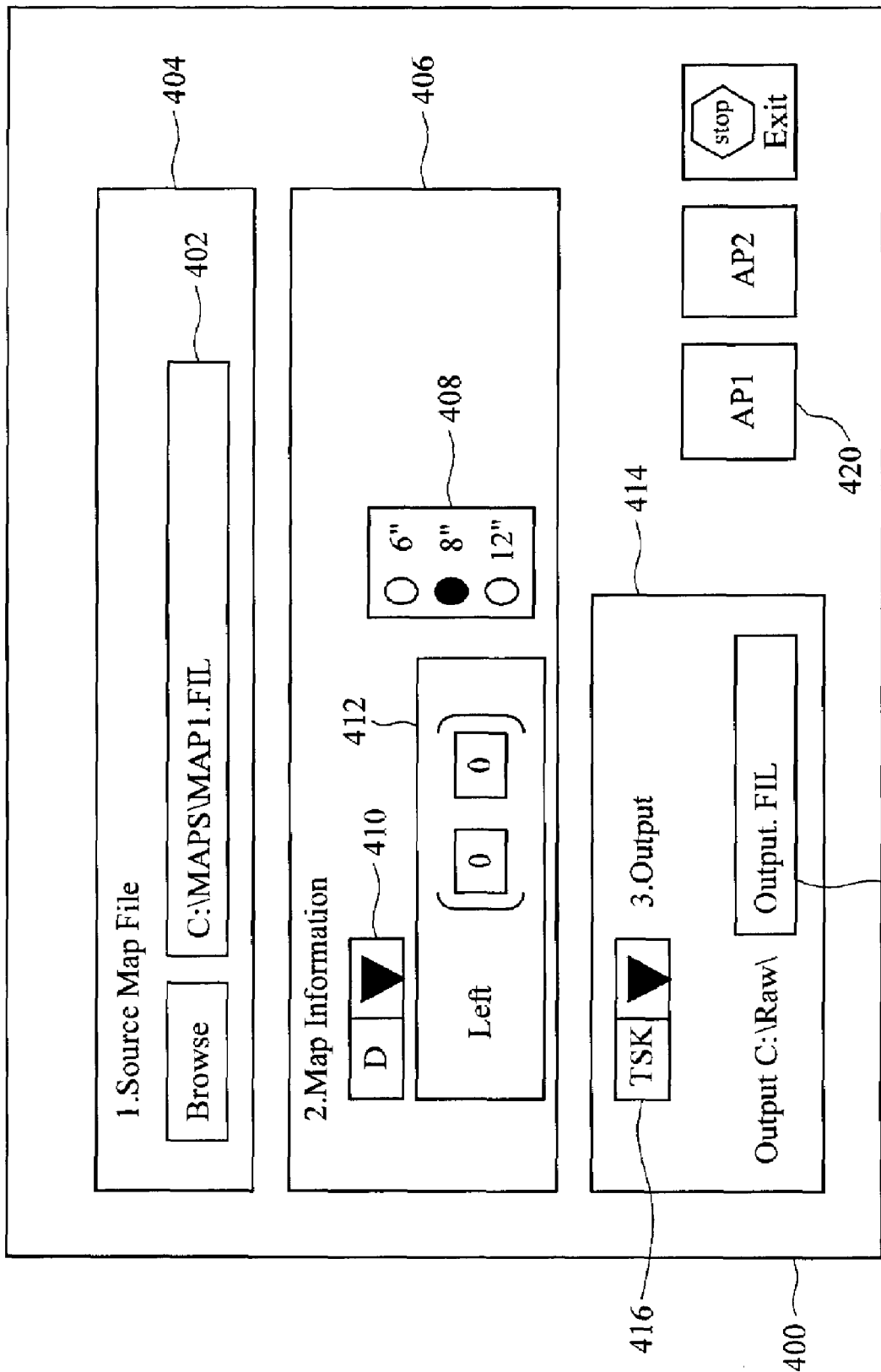
FIGS. 4-5 are graphical user interface diagrams to facilitate the automatic generation of the prober device file.

FIG. 4 is the user interface 400 for an embodiment of the automated probe file generation program. The user interface 400 includes a source map file input box 402, which is a part of the general input section 404 of the user interface 400. Using this source map file input box 402, the test operator can select the photo die input file to be read by the program in order to generate the automated prober device file. The second section for the user interface 400 is the map information section 406. The map information section 406 includes a set of radio buttons 408 that allow selection of the wafer size, e.g., 6 in., 8 in., and 12 in. Also included in the map information section 406 is a pull-down menu 410 that will identify the position of the notch on the wafer. The notch on the wafer is a physical characteristic that provides a frame of reference for the coordinate system defined on the wafer. With further regard to the defined coordinate system for a wafer, a coordinate basis identifier 412 sets forth the number of the lower left die in a Cartesian coordinate system.

Another section of the user interface 400 shown in FIG. 4 is the output section 414, which provides for the output prober device file to be properly formatted for the prober to use. Specifically, a pull-down menu 416 is provided for the user to select which prober is to be the target prober for generation of this prober device file. Also provided is a box 418 to fill in the name for the output prober device file.

Once the user has set up the appropriate input file map information and output information, the user can then execute the first stage of this program by clicking on the button AP 1420 for execution of the first program portion.

Figure 5:
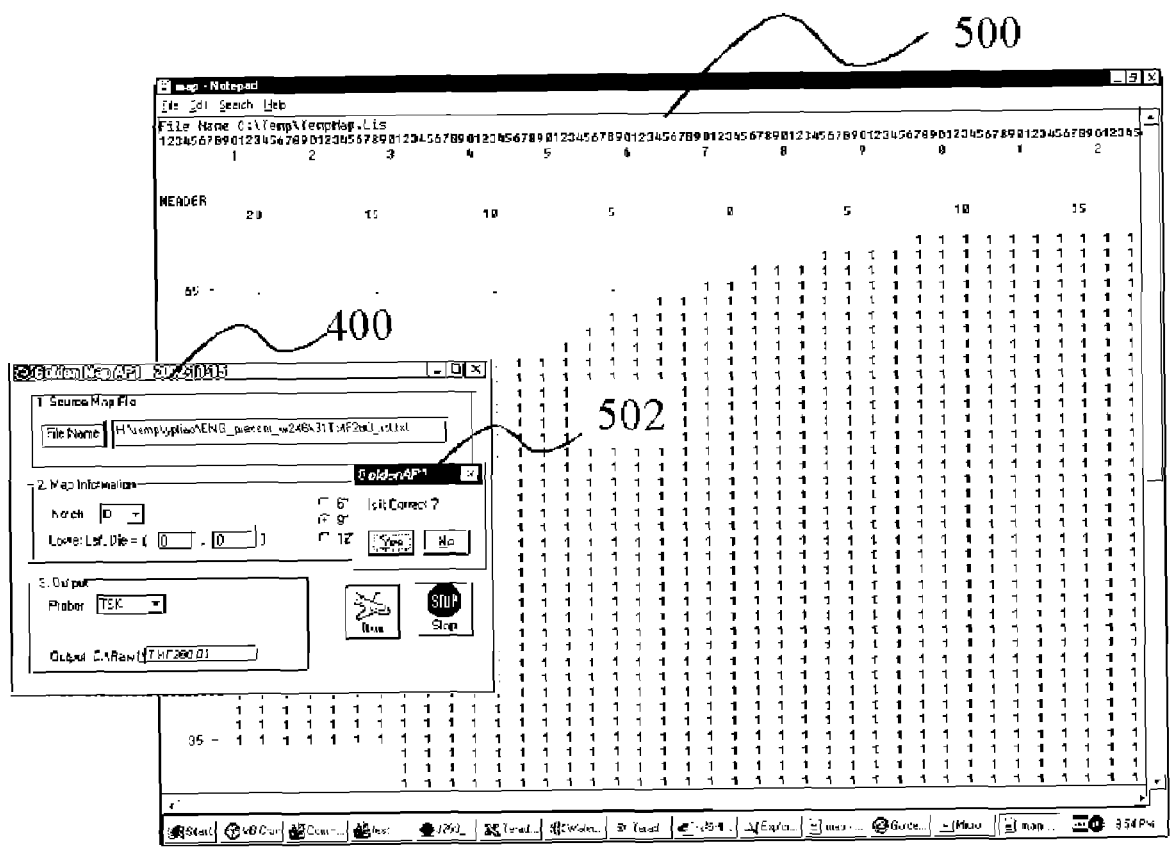

At FIG. 5, the output of the execution of the first AP1 file is shown. This output shows a wafer map in preliminary form or in raw form for the user's verification. Illustrated to the left on the original user interface 400 is a pop up window 502 querying whether the map information 500 appears to be correct to the user. If the user indicates "yes", then user is brought back to the user interface 400, which will finally present the opportunity for the user to generate the final merged device file, which would be properly formatted for the desired prober device.

Figure 6:
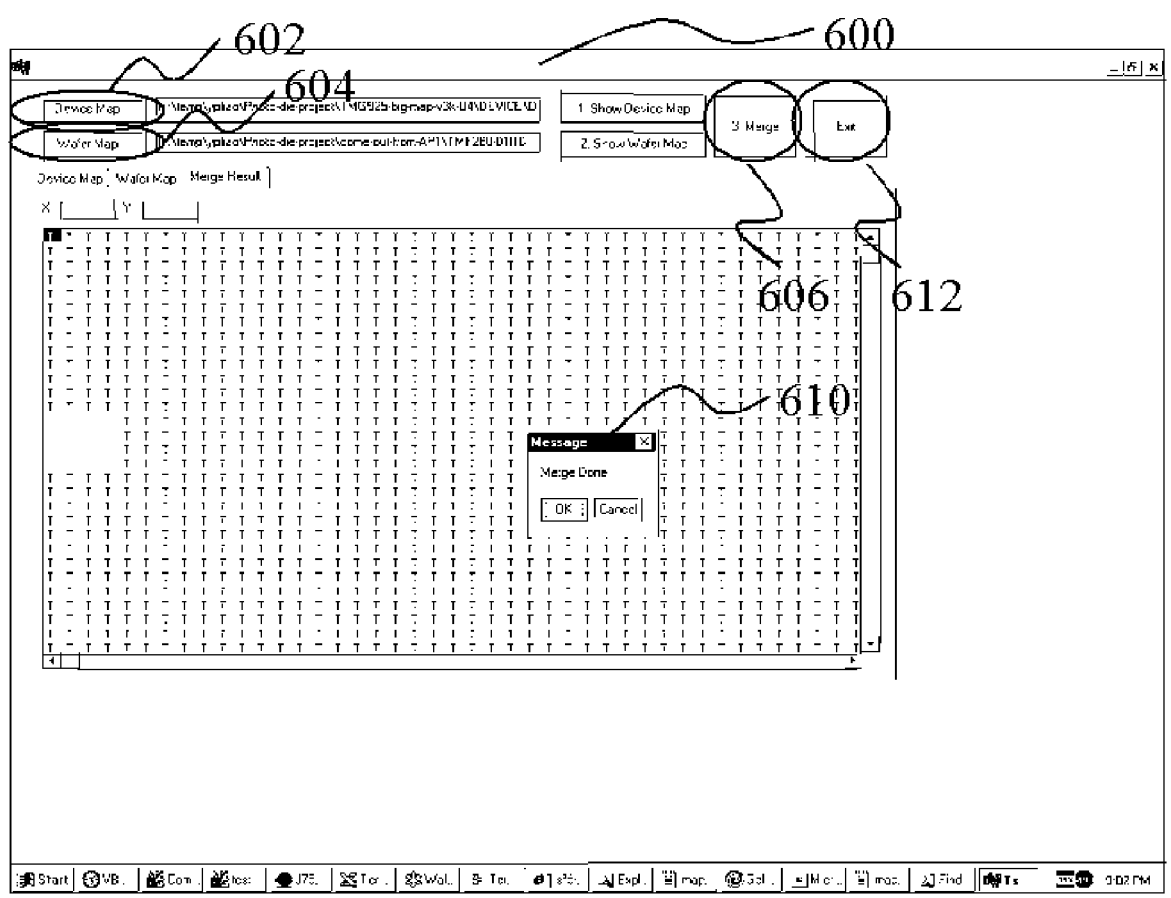
FIG. 6 is a user interface diagram for a final verification step within the described methods.

At FIG. 6, the final user interface 600 illustrates the merged device file, along with various final options that are presented to the user. On this user interface 600, the user can review the inputs leading up to the merged device file, inputs to the program, and the program's final results. For example, a button 602 is provided by which the user can again review the device map. Button 604 is provided whereby the user can re-review the wafer map initially viewed in FIG. 5. The merge button 606 is also provided whereby the merge is actually performed to finally generate the prober device file. A pop-up button 610 is provided to alert the user that the merge process has been completed and the auto generated probe device file has been completed for transfer to the device prober. At this point, the user can exit by clicking on the exit button 612 and take whatever other additional steps are necessary to get the file to the prober for its later execution of wafer probe testing. After a prober device file has been completed, die testing on a wafer may take place. Subsequently, die packaging may also take place.

Several embodiments have been described in detail hereinabove. It is to be understood that the scope of the invention also comprehends embodiments different from those described, yet within the scope of the claims. For example, the terms "microcontroller," "controller," "processing circuitry," and "control circuitry" comprehend ASICs (Application Specific Integrated Circuits), PAL (Programmable Array Logic), PLAs (Programmable Logic Arrays), PLDs (Programmable Logic Devices), decoders, memories, non-software based processors, or other circuitry, or digital computers, including microprocessors and microcomputers of any architecture, or combinations thereof. Memory devices include SRAM (static random access memory), DRAM (dynamic random access memory), pseudo-static RAM, latches, EEPROM (electrically-erasable programmable read-only memory), EPROM (erasable programmable read-only memory), registers, or any other memory device known in the art. Words of inclusion are to be interpreted as non-exhaustive in considering the scope of the invention. It should be understood that various embodiments of the invention can employ or be embodied in hardware, software or microcoded firmware.

While this invention has been described with reference to illustrative embodiments, these embodiments should not be construed to limit the scope of the invention claimed. It is to be understood that the scope of the invention also comprehends embodiments different from those described, yet within the scope of the claims. Words of inclusion are to be interpreted as nonexhaustive in considering the scope of the invention. Various modifications and combinations of the illustrative embodiments, as well as other embodiments of the invention, will be apparent to persons skilled in the art upon reference to the description. It is therefore intended that the appended claims encompass any such modifications or embodiments.

The section headings in this application are provided for consistency with the parts of an application suggested under 37 CFR 1.77 or otherwise to provide organizational cues. These headings shall not limit or characterize the invention(s) set out in any patent claims that may issue from this application. Specifically and by way of example, although the headings refer to a "Field of the Invention," the claims should not be limited by the language chosen under this heading to describe the so-called field of the invention. Further, a description of a technology in the "Background" or "Description of Related Art" is not be construed as an admission that technology is prior art to the present application. Neither is the "Summary of the Invention" to be considered as a characterization of the invention(s) set forth in the claims to this application. Further, the reference in these headings to "Invention" in the singular should not be used to argue that there is a single point of novelty claimed in this application. Multiple inventions may be set forth according to the limitations of the multiple claims associated with this patent specification, and the claims accordingly define the invention(s) that are protected thereby. In all instances, the scope of the claims shall be considered on their merits in light of the specification but should not be constrained by the headings included in this application.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations, and data stores are illustrated in the context of specific configurations. Other allocations of functionality are envisioned and will fall within the scope of claims that follow. Finally, structures and functionality presented as discrete components in the exemplary configurations may be implemented as a combined structure or component. These and other variations, modifications, additions, and improvements may fall within the scope of the invention as defined in the claims that follow.

What is claimed is:

1. A method for generating a prober device file, the method comprising:
   a. receiving a wafer image map, the wafer image map comprising information regarding where a plurality of dies are physically located on a wafer;
   b. receiving a device map, the device map comprising graphical information indicating which dies are to be tested and are to be sequentially identified within an overall test routine;
   c. translating the wafer image map into a format compatible with a semiconductor wafer prober;
   d. automatically mapping the physical location information of the wafer image map to the graphical information of the device map, whereby each wafer image map die is associated with one of the device map dies; and
   e. generating a completed prober device file comprising die positions and die testing information in the case of each die for the testing of certain ones of the dies of the completed wafer.

2. The method according to claim 1, wherein the wafer image map comprises wafer photo die information.

3. The method according to claim 1, and further comprising displaying a real-time display of the wafer and associated device test statuses on a wafer test system.

4. The method according to claim 3, wherein the real-time display of the wafer includes an illustration of real-time good die and bad die test results.

5. The method according to claim 1, wherein the automatic mapping of the wafer image map dies to the device map occurs substantially without user input.

6. The method according to claim 1, and further comprising presenting to a user a preliminary wafer map for the user's verification.

7. The method according to claim 6, wherein the generating of the completed prober device file occurs after the user's approval of the preliminary wafer map.

8. A method for generating a prober device file, the method comprising:
   a. receiving a wafer image map, the wafer image map comprising information regarding where a plurality of dies are physically located on a wafer;
   b. receiving a device map, the device map comprising graphical information indicating which dies are to be tested and are to be sequentially identified within the overall test routine;
   c. translating the wafer image map into a format compatible with a semiconductor wafer prober;
   d. automatically mapping the physical location information of the wafer image map dies to the graphical information of the device map, whereby each wafer image map die is associated with one of the device map dies;
   e. presenting to a user a preliminary wafer map for the user's verification; and
   f. upon a positive response by the user to the preliminary wafer map, generating a completed prober device file comprising die positions and die testing information in the case of each die for the testing of certain ones of the dies of the completed wafer.

9. The method according to claim 8, wherein the wafer image map comprises wafer photo die information.

10. The method according to claim 8, and further comprising displaying a real-time display of the wafer and associated device test statuses on a wafer test system.

11. The method according to claim 10, wherein the real-time display of the wafer includes an illustration of real-time good die and bad die test results.

12. The method according to claim 8, wherein the automatic mapping of the wafer image map dies to the device map occurs substantially without user input.

13. A method for packaging dies on a wafer, the method comprising:
   a. receiving a wafer image map, the wafer image map comprising information regarding where a plurality of dies are physically located on a wafer;
   b. receiving a device map, the device map comprising graphical information indicating which dies are to be tested and are to be sequentially identified within the overall test routine;
   c. translating the wafer image map into a format compatible with a semiconductor wafer prober;
   d. automatically mapping the physical location information of the wafer image map dies to the graphical information of the device map, whereby each wafer image map die is associated with one of the device map dies;
   e. generating a completed prober device file comprising die positions and die testing information in the case of each die for the testing of certain ones of the dies of the completed wafer; and
   f. packaging the dies of the completed wafer based on the completed prober device file.

14. The method according to claim 13, wherein the wafer image map comprises wafer photo die information.

15. The method according to claim 13, and further comprising displaying a real-time display of the wafer and associated device test statuses on a wafer test system.

16. The method according to claim 15, wherein the real-time display of the wafer includes an illustration of real-time good die and bad die test results.

17. The method according to claim 13, wherein the automatic mapping of the wafer image map dies to the device map occurs substantially without user input.

18. The method according to claim 13, and further comprising presenting to a user a preliminary wafer map for the user's verification.

19. The method according to claim 18, wherein the generating of the completed prober device file occurs after the user's approval of the preliminary wafer map.

20. The method according to claim 13, wherein packaging of the dies comprises packaging the dies that have been identified as good devices.

* * * * *